United States Patent
Pousset et al.

(10) Patent No.: US 7,525,390 B2
(45) Date of Patent: Apr. 28, 2009

(54) CIRCUIT FOR CONVERTING A DIFFERENTIAL SIGNAL INTO A NON-DIFFERENTIAL SIGNAL, AND RF TRANSMITTER COMPRISING SUCH A CIRCUIT

(75) Inventors: Fabien Pousset, Herbeys (FR); Jean-Charles Grasset, Moirans (FR); Philippe Cathelin, Laval (FR)

(73) Assignee: STMicroelectronics S.A., Montrouge (FR)

( * ) Notice: Subject to any disclaimer, the term of this patent is extended or adjusted under 35 U.S.C. 154(b) by 642 days.

(21) Appl. No.: 11/079,009

(22) Filed: Mar. 11, 2005

(65) Prior Publication Data
US 2005/0249310 A1    Nov. 10, 2005

(30) Foreign Application Priority Data
Mar. 12, 2004   (FR) .................................. 04 02596

(51) Int. Cl.
   *H03F 3/04* (2006.01)
(52) U.S. Cl. ........................ 330/301; 330/151; 330/282
(58) Field of Classification Search ................ 330/301, 330/86, 282, 291, 293, 151
See application file for complete search history.

(56) References Cited
U.S. PATENT DOCUMENTS
6,057,737 A    5/2000  Pritchard .................... 330/300
7,098,742 B2*  8/2006  Johnson ...................... 330/301
7,113,045 B2*  9/2006  Westwick et al. ........... 330/301

FOREIGN PATENT DOCUMENTS
CH   346914       6/1960
EP   0 595 561 A1 5/1994
EP   0 785 617 A2 7/1997
EP   0 877 479 A1 11/1998

OTHER PUBLICATIONS
Horowitz, P., et al., "The Art of Electronics," Cambridge University Press, p. 238, fig. 4.73, 1989. XP002304706.
* cited by examiner

*Primary Examiner*—Khanh V Nguyen
(74) *Attorney, Agent, or Firm*—Lisa K. Jorgenson; David V. Carlson; Seed IP Law Group PLLC

(57) ABSTRACT

A circuit for converting a differential signal into a nondifferential signal comprising first and second inputs respectively receiving first and second components of a differential signal. The circuit comprises a single bipolar transistor having an emitter, a base and a collector. The transistor is biased so as to allow flowing of an emitter d.-c. bias current sufficient to allow a linear conversion of a differential RF signal, for example. Both components of the differential RF signal are respectively injected into the emitter and the base of the bipolar transistor so that a remarkably linear conversion is carried out by means of a very simple circuit. The circuit is particularly adapted to the realization of an integrated RF transmission chain.

13 Claims, 3 Drawing Sheets

CIRCUIT FOR CONVERTING A DIFFERENTIAL SIGNAL INTO A NON-DIFFERENTIAL SIGNAL, AND RF TRANSMITTER COMPRISING SUCH A CIRCUIT

BACKGROUND OF THE INVENTION

1. Field of the Invention

The present invention relates to the field of electronic circuits and in particular to a circuit for converting a differential signal into a nondifferential signal.

2. Description of the Related Art

In many electronic applications, and in particular in communication systems, signal is processed in a differential form in order to ensure optimal linearity and especially immunity to external disturbances.

That is particularly the case in the field of transmissions. If one considers, for example, a radio frequency (RF) transmission chain as illustrated in FIG. 1, it can be seen that an Intermediary Frequency (IF) signal 1 is mixed with a signal 2 generated by a local oscillator (LO) by means of a mixer 3 in order to produce an RF signal, which is then transmitted to a pre-power amplifier PPA 11. The immunity of the signal to external disturbances and the processing linearity of such a chain—illustrated only as an example here—are ensured by the differential mode used for signals and, in general, mixer 3 and pre-power amplifier 11 can be provided by means of a single integrated circuit. The output signal of amplifier 11 is transmitted to an impedance adaptor circuit 12, then to a circuit 15 known as a BALUN circuit that converts the signal into a nondifferential mode before transmission to a surface acoustic wave (SAW) filter 13, which filter is very selective, so that only the RF part of the signal is selected. After filtering, the nondifferential signal is transmitted to a power amplifier 14 for amplification before transmission to a transmitting antenna (not shown). The SAW filter and the PPA are generally not differential devices. This is why the BALUN circuit is used to convert the differential signal into a nondifferential signal.

As can be seen in the diagram of FIG. 1, BALUN block 15 carries out the conversion of a differential signal into a nondifferential signal. The disadvantage of such a structure lies in the fact that BALUN circuit 15 is external to the integrated circuit realizing the mixer and the pre-power amplifier, which significantly increases the function's manufacturing costs.

A second technique exists. It consists in using only one of the two differential outputs of the pre-power amplifier and replacing the differential adaptor circuit 12 by a nondifferential adaptor circuit 22. This technique makes it possible to avoid using the BALUN circuit. However, this solution is very power consuming and is not optimal as regards signal linearity.

A third known technique making it possible to remove the BALUN circuit consists in using a circuit of the CAPRIO-QUAD-type (an evolution of the Cross-Quad proposed by Caprio). This technique makes it possible to convert a differential signal into a nondifferential signal, but at the expense of power-consumption and linearity.

A fourth technique, known as "current combiner", makes it possible to convert a differential signal into a nondifferential signal. This device comprises a tuned circuit based on a passive network of inductive resistors and capacitors. One disadvantage of this solution, amongst others, lies in the fact that inductors—when they are integrated into an integrated circuit—occupy considerable space on the silicon substrate and therefore increase the manufacturing cost of such a circuit. Moreover, the performances of this type of circuit largely depend on the precision with which its elements are manufactured.

Thus, it can be noted that a simple solution is yet to be found to allow integration of a circuit for converting a differential signal into a nondifferential signal, particularly adapted to the realization of an RF signal transmission chain, in a semiconductor substrate. This is why, in practice, many concrete realizations include a BALUN circuit outside the integrated circuit, the use of which BALUN circuit has an impact on emitter manufacturing costs.

It would be desirable to have a circuit occupying minimum space on a substrate and making it possible to convert a differential signal into a nondifferential signal.

BRIEF SUMMARY OF THE INVENTION

One object of the present invention is to provide a circuit for converting a differential signal into a nondifferential signal, which is simple and low cost, and allows excellent linearity.

Another object of this invention is to provide a differential signal converter that is particularly adapted to a transmitting chain of an RF transmission system.

The invention achieves these objects by a circuit for converting a differential signal into a nondifferential signal that comprises first and second inputs respectively receiving first and second components of a differential signal. The circuit comprises a single bipolar transistor having an emitter, a base and a collector. The transistor is biased so as to allow flowing of an emitter d.-c. bias current sufficient to allow a linear conversion of a differential RF signal, for example. Both components of the differential RF signal are respectively injected into the emitter and the base of the bipolar transistor so that a remarkably linear conversion is carried out by means of a very simple circuit.

Thus, in a particularly simple and effective manner, a nondifferential to differential converter circuit is realized, which requires no inductor and is easy to integrate onto a semiconductor substrate.

Preferably, the base and the emitter are earthed by resistors Zb and Ze whose impedances are lower than the internal impedance of the differential source driving the converter circuit.

In a particular embodiment, a negative feedback of the collector output current is injected by means of a connection between the collector and the base, by serializing an impedance Zb and a gain Kb. Similarly, a negative feedback of the output current is injected by means of a connection between the collector and the emitter, by serializing an impedance Ze and a gain –Ke.

The invention allows the realization of an integrated RF transmission chain comprising:

a mixer for mixing an intermediate frequency signal and a signal generated by a local oscillator in order to produce an RF signal;

a differential pre-power amplifier circuit for amplifying the output signal of said mixer and outputting first and second components of a differential signal;

a differential/nondifferential converter comprising a single bipolar transistor having an emitter, a base and a collector, said transistor being biased so as to allow flowing of an emitter d.-c. bias current strong enough to allow linear conversion; the emitter of said bipolar transistor receiving the first component of said differential signal, and the base of said transistor receiving the second component of the differential signal, the collector of said transistor outputting a current proportional to the difference of said first and second components of the differential signal.

BRIEF DESCRIPTION OF THE SEVERAL VIEWS OF THE DRAWINGS

Other features, objects and advantages of the invention will be made clear when reading the following description and drawings, only given by way of nonrestrictive examples. In the accompanying drawings.

DETAILED DESCRIPTION OF THE INVENTION

Figure 1:
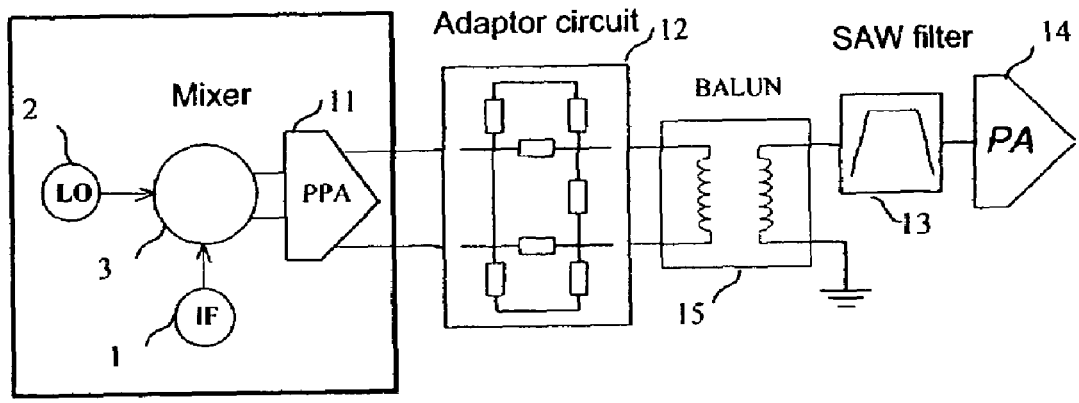
FIG. 1 illustrates a traditional RF signal transmitting chain, with a differential integrated circuit output and use of a BALUN circuit.
Figure 2:
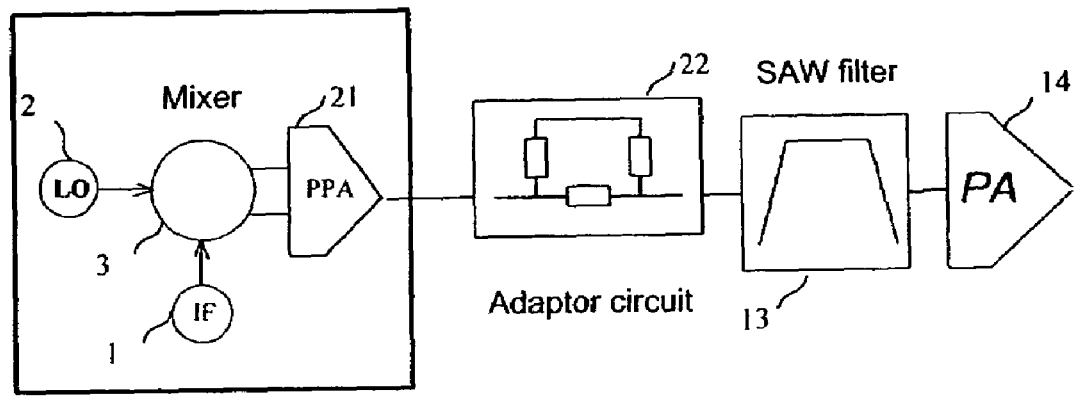
FIG. 2 illustrates a second known technique making it possible to avoid the use of a BALUN circuit, based on a nondifferential pre-power amplifier.
Figure 3:
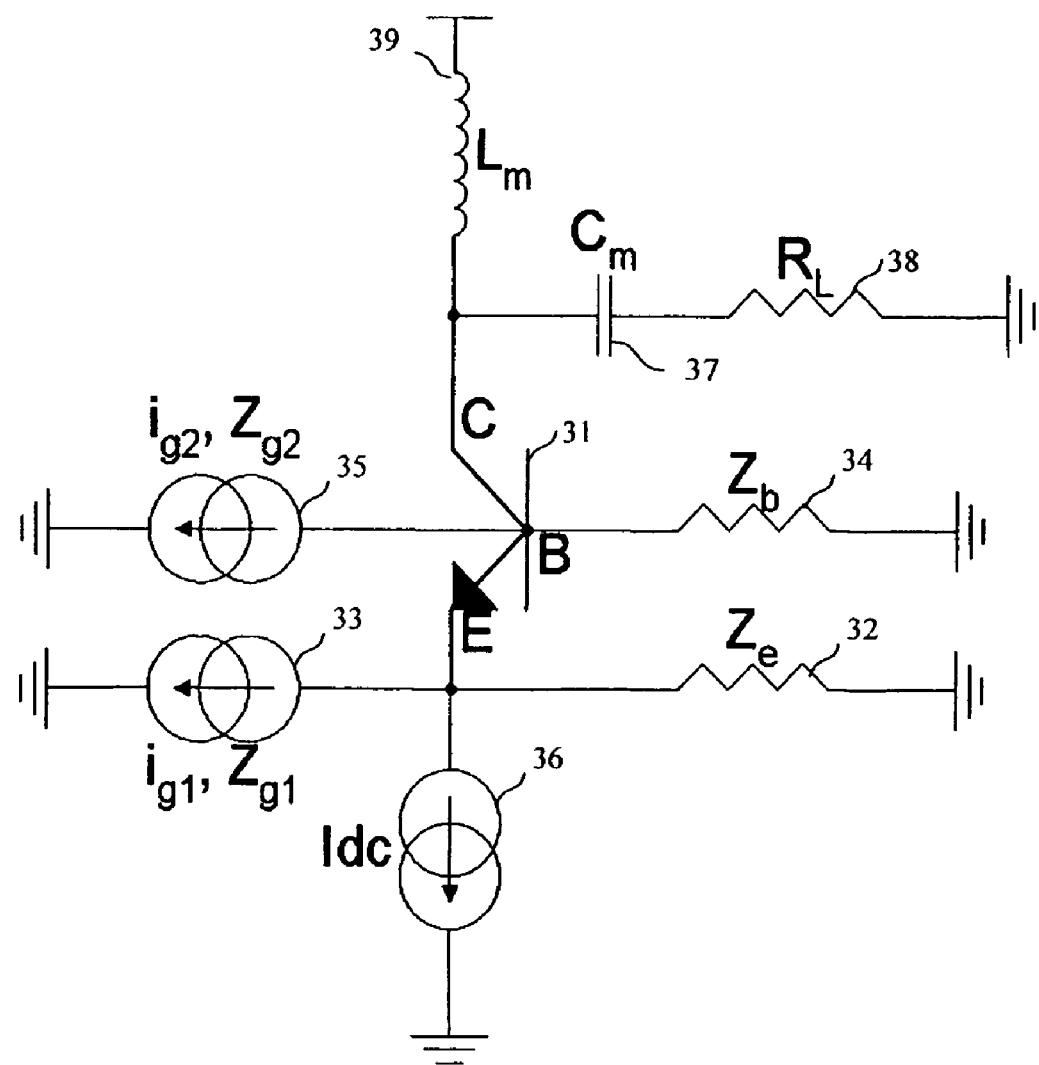
FIG. 3 illustrates a preferred embodiment of a circuit for converting a differential signal into a nondifferential signal according to the present invention.

FIG. 3 illustrates an embodiment of a circuit for converting a differential signal into a signal nondifferential, according to the present invention.

This circuit is based on a bipolar transistor 31 comprising a base, an emitter and a collector and the transistor is biased by means of a static or zero signal current—represented by a power source 36 ($I_{dc}$)—sufficiently high to guarantee conversion linearity. In practice, zero signal current should be chosen higher than RF current.

Figure 5:
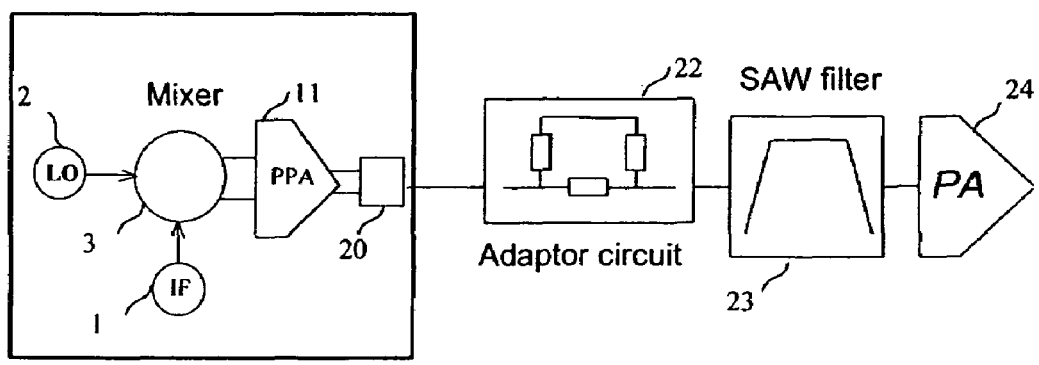
FIG. 5 illustrates the use of the converter circuit according to the present invention in an RF transmission chain.

The circuit is driven by two differential signals that are represented, for clarity's sake, by two power sources, respectively a first source 33 (ig1) having an internal impedance Zg1, and a second source 35 (ig2) having an impedance Zg2. In a practical way, impedances Zg1 and Zg2 correspond to the output impedances of the stage preceding the converter circuit, in general a pre-power amplifier circuit, as shown in FIG. 5.

The emitter of transistor 31 is connected to the first power source 33 and is also earthed via a first impedance resistor 32 (of impedance Ze), which could be a plain resistor.

The base of transistor 31 is connected to the second power source 35 and is also earthed via a second impedance or resistor 34 (of impedance Zb).

In a practical way, impedances Zb and Ze will be chosen sufficiently low compared to internal impedances Zg1 and Zg2 of both differential inputs. It will be noted that Ze and Zb are not necessarily resistances. More generally they will be impedances (with a real part and an imaginary part).

At the output, transistor 31 is charged by an adaptor network that can be of any kind. In the circuit shown in FIG. 3, the adaptor network is illustrated by an inductance 39 (Lm) mounted in parallel with a set comprising—in series—a capacitor 37 (Cm) and a load 38 (RL).

The network illustrated in FIG. 3 is only one particular example of an impedance adaptor network and people qualified in the art will be able to design any other specific network.

If gm is the coefficient of transconductance transistor 31, and if β is the ratio of collector and base currents, then the following formula can be written as a first approximation for the collector RF output current i as a function of both RF differential components i1 and i2:

$$i = \frac{g_m \cdot (Z_2 \cdot i_2 - Z_1 \cdot i_1)}{1 + g_m \cdot Z_1 \cdot \frac{\alpha_Z}{\alpha}}$$

$$Z_1 = \frac{Z_{g1} \cdot Z_e}{Z_{g1} + Z_e} \quad Z_2 = \frac{Z_{g2} \cdot Z_b}{Z_{g2} + Z_b} \quad \alpha_Z = \frac{1}{\beta + 1} \cdot \frac{Z_2}{Z_1} + 1 \quad \alpha = \frac{\beta}{\beta + 1}$$

It is thus noted that transistor 31 simultaneously performs two functions: a function of amplification and a function of conversion of a differential signal comprising two components i1 and i2 injected in the emitter and the base of the transistor respectively, and converted at the collector into a nondifferential signal.

Above all it has been observed that there is a remarkable linearity in the conversion performed by this very simple and nonetheless very effective circuit.

This performance is even more astonishing since the described approach, based on an a priori nonsymmetrical processing of both components of the differential signal, stands out in sharp contrast with a traditional approach.

Indeed, traditionally, a perfectly symmetrical circuit is provided for each of the components of a differential signal, such as, for example, the base of a transconductance amplifier.

By contrast with the invention, from the outset a nonsymmetrical approach is opted for: the first component (i1 or ig1) of the differential signal is fed to the base of transistor 31 while the second component (i2 or ig2) is fed to the transistor's emitter electrode.

Thus, a differential signal is processed very unusually by means of a single transistor, which sharply contrasts with the traditional approach that consists in processing a differential signal by means of a symmetrical structure, such as, for example, the two bases forming the input of a differential transconductance amplifier. So, according to the invention, the asymmetrical structure composed of the single bipolar transistor 31 is used to process both components of a differential signal having, if necessary, a common mode in relation to ground to which the transistor is connected.

It is needless to insist on how easily such a circuit can be integrated on a semiconductor substrate.

Figure 4:
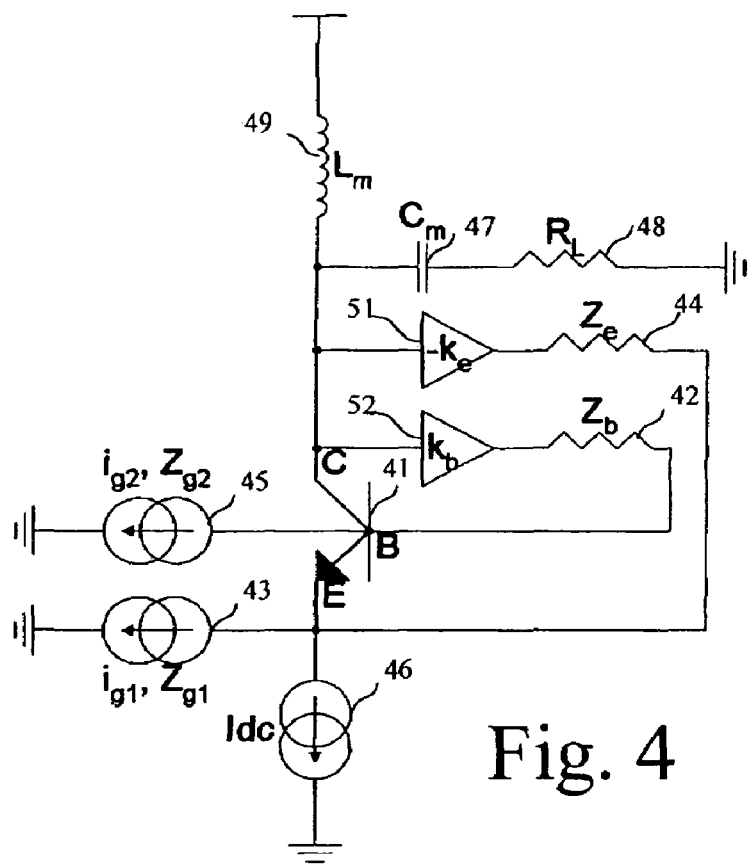
FIG. 4 illustrates a second embodiment of a circuit for converting a differential signal into a nondifferential signal.

FIG. 4 shows an alternate embodiment in which both impedances Zb and Ze are not earthed but are used to reintroduce a negative feedback, respectively towards the base and the emitter. More precisely, and for clarity's sake, each element 4x of FIG. 4 corresponds to an element 3x of FIG. 3. The circuit of FIG. 4 comprises a bipolar transistor 41 comprising a base, an emitter and a collector. Transistor 41 is biased, like previously, by means of a power source $I_{dc}$ 46 that allows flowing of an emitter d.-c. bias current sufficiently high compared to RF current. Both inputs of the differential signal, respectively represented by two power sources 43 (ig1, of impedance Zg1) and 45 (ig2, of impedance Zg2), are connected to the emitter and the base of transistor 41, the collector of which is charged by an adaptor network comprising an inductor Lm 49, a capacitor Cm 47 and a load RL 48.

The collector of transistor 41 is connected to the input of a first amplifier 51 having a gain −Ke, whose output is connected via an impedance Ze 44 to the emitter of transistor 41. In practice, gain −Ke could be carried out by adding an additional active element to transistor 31, such as, for example, another bipolar transistor.

Similarly, the collector of transistor 41 is connected to the input of a second amplifier 51 having a gain Kb, whose output is connected via an impedance Zb 42 to the base of transistor 41. Similarly to gain −Ke, Kb could be carried out by means of an additional active element.

Other alternate embodiments could be considered. In particular and as an example, transistor 4 could be biased using mere current mirroring. In any case, the impedance introduced to carry out continuous biasing should not interfere in RF mode.

In this alternative, the amplification gain is reduced by the introduction of the negative feedback in the base and the emitter, but conversion linearity is even more increased. Moreover, the negative feedback makes it possible to control the adaptation of the output impedance.

FIG. 5 illustrates the use of a converter circuit as previously described in an RF signal transmission chain. As can be seen, signal Fl 1 is mixed with signal 2 generated by a local oscillator by means of a mixer 3 and is then amplified via a differential prepower amplifier PPA 11. The differential signal output by the pre-power amplifier is then presented to the input of a converter 20 according to the one described in reference to FIG. 3, which then generates a nondifferential signal.

The circuit that has been just described can be used in a number of applications other than RF.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A circuit to convert a differential signal into a nondifferential signal, said circuit comprising:
   first and second inputs respectively receiving first and second components of a differential signal; and
   a single bipolar transistor including an emitter, a base and a collector, said single bipolar transistor being biased so as to allow flow of an emitter DC bias current sufficient to allow a linear conversion;
   said first input being coupled to the emitter of said single bipolar transistor, said second input being coupled to the base of said single bipolar transistor; and
   said collector of said single bipolar transistor being coupled to output a current proportional to a difference of said first and second components of the differential signal.

2. The circuit according to claim 1 wherein the base is earthed via an impedance resistor Zb whose impedance is lower than an internal impedance of a differential source component fed to the circuit's base.

3. The circuit according to claim 1 wherein the emitter is earthed via an impedance resistor Ze whose impedance is lower than an internal impedance of a differential source component fed to the circuit's emitter.

4. The circuit according to claim 1 wherein it comprises an output current negative feedback carried out by a connection between the collector and the base, by serializing an impedance Zb and a gain Kb.

5. The circuit according to claim 1 wherein it comprises an output current negative feedback carried out by a connection between the collector and the emitter, by serializing an impedance Ze and a gain −Ke.

6. A circuit to transmit an RF signal in a communication system, said circuit comprising:
   a mixer to mix an intermediate frequency signal and a signal generated by a local oscillator in order to produce an RF signal;
   a differential pre-power amplifier circuit to amplify the output signal of said mixer and to output first and second components of a differential signal; and
   a differential/nondifferential converter including a single bipolar transistor having an emitter, a base and a collector, said single bipolar transistor being biased to allow flow of an emitter DC bias current strong enough to allow linear conversion; the emitter of said single bipolar transistor being coupled to receive the first component of said differential signal, and the base of said single bipolar transistor being coupled to receive the second component of the differential signal, the collector of said single bipolar transistor being coupled to output a current proportional to a difference of said first and second components of the differential signal.

7. The transmission circuit according to claim 6 wherein the base is earthed via an impedance resistor Zb whose impedance is lower than an internal output impedance of said differential pre-power amplifier.

8. The transmission circuit according to claim 6 wherein the emitter is earthed via an impedance resistor Ze whose impedance is lower than an internal impedance of said differential pre-power amplifier.

9. The transmission circuit according to claim 6 wherein it comprises a negative feedback of the output signal carried out by a connection between the collector and the base, by serializing an impedance Zb and a gain Kb.

10. The transmission circuit according to claim 6 wherein it comprises a negative feedback of the output signal carried out by a connection between the collector and the emitter, by serializing an impedance Ze and a gain −Ke.

11. A method of converting a differential signal having two components to a nondifferential signal, comprising:
    applying a first component of the differential signal to a base of a single bipolar transistor;
    applying a second component of the differential signal to an emitter of the single bipolar transistor; and
    sensing the nondifferential signal as an output at a collector of the single bipolar transistor.

12. The method of claim 11 wherein said single bipolar transistor forms part of an asymmetric structure.

13. The method of claim 11 wherein said output at said collector includes a current proportional to a difference of said first and second components.

* * * * *